(12) United States Patent
Koresawa et al.

(10) Patent No.: US 8,748,875 B2
(45) Date of Patent: Jun. 10, 2014

(54) ORGANIC ELECTRO-LUMINESCENCE DISPLAY DEVICE

(75) Inventors: Kouhei Koresawa, Nara (JP); Masafumi Matsui, Kyoto (JP); Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 226 days.

(21) Appl. No.: 13/451,016

(22) Filed: Apr. 19, 2012

(65) Prior Publication Data

US 2012/0199856 A1 Aug. 9, 2012

Related U.S. Application Data

(63) Continuation of application No. PCT/JP2009/005974, filed on Nov. 10, 2009.

(51) Int. Cl.
*H01L 33/44* (2010.01)

(52) U.S. Cl.
USPC .......... 257/40; 257/89; 257/98; 257/E51.022; 257/E33.06

(58) Field of Classification Search
USPC ................ 257/40, 89, 98, E51.022, E33.06
See application file for complete search history.

(56) References Cited

U.S. PATENT DOCUMENTS

| | | | |
|---|---|---|---|
| 6,969,948 B2 | 11/2005 | Urabe et al. | |
| 6,971,938 B2* | 12/2005 | Urabe et al. | 445/24 |
| 7,045,949 B2 | 5/2006 | Yamada et al. | |
| 7,081,704 B2* | 7/2006 | Yamazaki et al. | 313/500 |
| 7,329,985 B2* | 2/2008 | Yamazaki et al. | 313/506 |
| 7,804,552 B2 | 9/2010 | Yamazaki et al. | |
| 2002/0017645 A1* | 2/2002 | Yamazaki et al. | 257/72 |
| 2002/0190639 A1 | 12/2002 | Yamada et al. | |
| 2003/0107314 A1 | 6/2003 | Urabe et al. | |
| 2004/0027055 A1 | 2/2004 | Yamazaki et al. | |
| 2004/0147200 A1 | 7/2004 | Urabe et al. | |
| 2005/0046321 A1 | 3/2005 | Suga et al. | |
| 2005/0073247 A1 | 4/2005 | Yamazaki et al. | |
| 2006/0250073 A1 | 11/2006 | Yamazaki et al. | |

(Continued)

FOREIGN PATENT DOCUMENTS

| | | |
|---|---|---|
| CN | 1426269 | 6/2003 |
| CN | 1541384 | 10/2004 |

(Continued)

OTHER PUBLICATIONS

International Search Report of PCT/JP2009/005974, Dec. 28, 2009.

(Continued)

*Primary Examiner* — George Fourson, III
(74) *Attorney, Agent, or Firm* — Greenblum & Bernstein, P.L.C.

(57) ABSTRACT

An organic electro-luminescence (EL) display device according to the present invention includes: a main substrate; a display section provided above the main substrate and including a red light-emitting layer, a green light-emitting layer, a blue light-emitting layer, and a bank; a blue color filter provided above the display section, which selectively transmits blue light and selectively absorbs green light and red light; and a red color filter provided above the display section, which selectively transmits the red light and selectively absorbs the blue light and the green light, wherein the blue color filter has openings each at a position corresponding to the red light-emitting layer or the green light-emitting layer, and the red color filter has openings each at a position corresponding to the green light-emitting layer or the blue light-emitting layer.

6 Claims, 13 Drawing Sheets

(56) References Cited

U.S. PATENT DOCUMENTS

| | | | |
|---|---|---|---|
| 2009/0141221 A1* | 6/2009 | Taguchi et al. | 349/109 |
| 2011/0155296 A1 | 6/2011 | Nakamura et al. | |
| 2012/0025699 A1* | 2/2012 | Okumoto et al. | 313/506 |
| 2012/0168787 A1* | 7/2012 | Okumoto et al. | 257/89 |
| 2012/0199856 A1* | 8/2012 | Koresawa et al. | 257/89 |
| 2012/0206066 A1* | 8/2012 | Takagi | 315/312 |

FOREIGN PATENT DOCUMENTS

| | | |
|---|---|---|
| EP | 1447785 | 8/2004 |
| JP | 2-220002 A | 9/1990 |
| JP | 2000-021570 | 1/2000 |
| JP | 2002-082630 A | 3/2002 |
| JP | 2002-373776 | 12/2002 |
| JP | 2003-234186 | 8/2003 |
| JP | 2003-332070 | 11/2003 |
| JP | 2004-094236 A | 3/2004 |
| JP | 2005-099393 | 4/2005 |
| JP | 2005-128499 | 5/2005 |
| JP | 2006-310075 | 11/2006 |
| JP | 2007-220395 | 8/2007 |
| JP | 2008-203436 | 9/2008 |
| JP | 2008-303363 | 12/2008 |
| JP | 2009-032576 | 2/2009 |

OTHER PUBLICATIONS

International Preliminary Report on Patentability (Chaper II) of PCT/JP2009/005974, May 10, 2011.
Search report from E.P.O., mail date is Jul. 26, 2012.
China Office Action and Search Report mailed Feb. 13, 2014 and English translation of Search Report.

* cited by examiner

ORGANIC ELECTRO-LUMINESCENCE DISPLAY DEVICE

CROSS REFERENCE TO RELATED APPLICATION

This is a continuation application of PCT Patent Application No. PCT/JP2009/005974 filed on Nov. 10, 2009, designating the United States of America. The entire disclosures of the above-identified applications, including the specifications, drawings and claims are incorporated herein by reference in their entirety.

BACKGROUND OF THE INVENTION (1) Field of the Invention

The present invention relates to an organic electro-luminescence (EL) display device capable of emitting light in multiple colors.

(2) Description of the Related Art

A display panel (organic EL display) using an organic light-emitting unit (Organic Light-Emitting Diode: OLED) has been known as a display panel using current-driven light-emitting material. Since the display panel has advantages such as good viewing angle characteristics and small power consumption, the display panel has been attracting attention as a candidate for a next-generation flat panel display.

As a configuration of the display panel using the organic light-emitting unit, a configuration in which pixels each having organic light-emitting units each of which is formed with organic light-emitting material which emits light in blue, green, or red are arranged in a matrix or a delta shape on an entire surface has been proposed.

In this configuration, each pixel has a color filter of a different color for each of the colors of light emitted, and a configuration with a light-blocking property by the color filters included in the two pixels or three pixels neighboring the non light-emitting region of each pixel overlapping with each other has been proposed (see Patent Literature 1: Japanese Unexamined Patent Application Publication No. 2003-234186). With this configuration, it is possible to secure the light-blocking property at the non light-emitting region without forming a filter known as a black matrix for suppressing the reflection of external light above the non light-emitting region. In other words, it is possible to secure the light-blocking property of the non light-emitting region with a simple configuration.

Furthermore, a configuration in which each pixel includes color filters different for each color of the light emitted, and a black matrix above the non light-emitting region, and a red color filter which transmits red light and a blue color filter which transmits blue light are arranged at a position corresponding to an active element on the black matrix (see Patent Literature 2: Japanese Unexamined Patent Application Publication No. 2005-99393). With this configuration, compared to the case in which only the black matrix is provided above the non light-emitting region, the light-blocking property of the light-emitting region is further improved, suppressing malfunction of the active elements and suppressing the reduction in the display quality.

Furthermore, another configuration in which a red color filter transmitting red light is formed above the light-emitting region of red, and a blue color filter transmitting blue light is formed above the blue light-emitting region, and no color filter is arranged above the green light emitting region has been proposed. (see Patent Literature 3: Japanese Unexamined Patent Application Publication No. 2002-373776).

According to this configuration, it is possible to improve the contrast with less number of patterning.

Here, contrast represents a ratio of luminance in the non light-emitting region to the luminance in the light-emitting region (luminance of light-emitting region divided by luminance of non light-emitting region). When the luminance of the non-light emitting region is high due to reflected external light, the contrast is inherently low, and the display device cannot display a sharp image. On the other hand, when the luminance of the non-light emitting region is low, the contrast is high, and deeper black can be displayed, allowing the display device to display a sharp image.

SUMMARY OF THE INVENTION

However, with the configuration of Patent Literature 1, the reflectance property of the non light-emitting region cannot be uniform in the entire display due to non-uniform filter configuration above the non light-emitting region. More specifically, with the configuration according to Patent Literature 1, the configuration of the filter corresponding to the non light-emitting region includes four types depending on the combination of the adjacent pixels, that is, red and green, green and blue, blue and red, and red and green and blue, causing unevenness in the contrast of the display. Furthermore, in the configuration according to Patent Literature 1, the light-blocking property is secured by overlapping filters in different colors. Thus, the adjacent pixels for overlapping filters cannot be in the same color, causing limitation in arranging pixels in RGB. With the configuration in Patent Literature 2, processes for separately applying four types of materials including the material for pigments of color filters in red, blue, and green, and the visible light absorbing material corresponding to the black matrix are necessary. Consequently, the cost necessary for forming the color filters is inevitably high. Patent Literature 3 does not mention the filter configuration corresponding to the non light-emitting region. If the filter is not provided above the non light-emitting region, the reflectance at the non light-emitting region is high, reducing the contrast of the display.

Furthermore, three types of pigment materials corresponding to the color filters in red, blue, and green are necessary for the configuration in Patent Literature 1, and four types of materials including pigment materials corresponding to the color filters in red, blue, and green, and the visible light absorbing material corresponding to the black matrix are necessary for the configuration in Patent Literature 2. In addition, processes for separately applying the filters are necessary in the manufacturing process. In order to reduce the cost for materials and manufacturing cost, the smaller number of colors is preferable for color filters.

The present invention has been conceived in view of the problems above, and it is an object of the present invention to provide an organic EL display device with high contrast at low cost.

In order to solve the problems described above, the organic EL display device according to the present invention includes: a main substrate; a display section provided above the main substrate and including a red organic EL light-emitting region, a non light-emitting region around the red organic EL light-emitting region, a green organic EL light-emitting region, a non light-emitting region around the green organic EL light-emitting region, a blue organic EL light-emitting region, and a non light-emitting region around the blue organic EL light-emitting region; a first light-adjusting layer provided above the display section, which selectively transmits blue light and selectively absorbs green light and red light; a second light-adjusting layer provided above the display section, which selectively transmits the red light and selectively absorbs the blue light and the green light; and a third light-adjusting layer which selectively absorbs light having a wavelength between the red light and the green light, in which a light-adjusting layer which selectively transmits the green light and selectively absorbs the red light and the blue light is omitted, the first light-adjusting layer is continuously formed over positions each corresponding to the blue organic EL light-emitting region, the non light-emitting region around the red organic EL light-emitting region, the non light-emitting region around the green organic EL light-emitting region, or the non light-emitting region around the blue organic EL light-emitting region, and has openings each at a position corresponding to the red organic EL light-emitting region or the green organic EL light-emitting region, and the second light-adjusting layer is continuously formed over positions each corresponding to the red organic EL light-emitting region, the non light-emitting region around the red organic EL light-emitting region, the non light-emitting region around the green organic EL light-emitting region, or the non light-emitting region around the blue organic EL light-emitting region, and has openings each at a position corresponding to the blue organic EL light-emitting region or the green organic EL light-emitting region, the third light-adjusting layer is provided above the display section, and is substantially uniformly formed over the entirety of the display section, and in the third light-adjusting layer, a maximum value of a transmission factor of visible light is 80% or higher, and a minimum value of the transmission factor of visible light is 50% or lower, wavelengths indicating a transmission factor of 60% are in ranges from 550 nm to 575 nm and from 585 nm to 620 nm, and a wavelength indicating the minimum value of the transmission factor is in a range from 570 nm to 600 nm.

According to the present invention, it is possible to provide an organic EL display device with high display quality at low cost.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENTS

Figure 1:
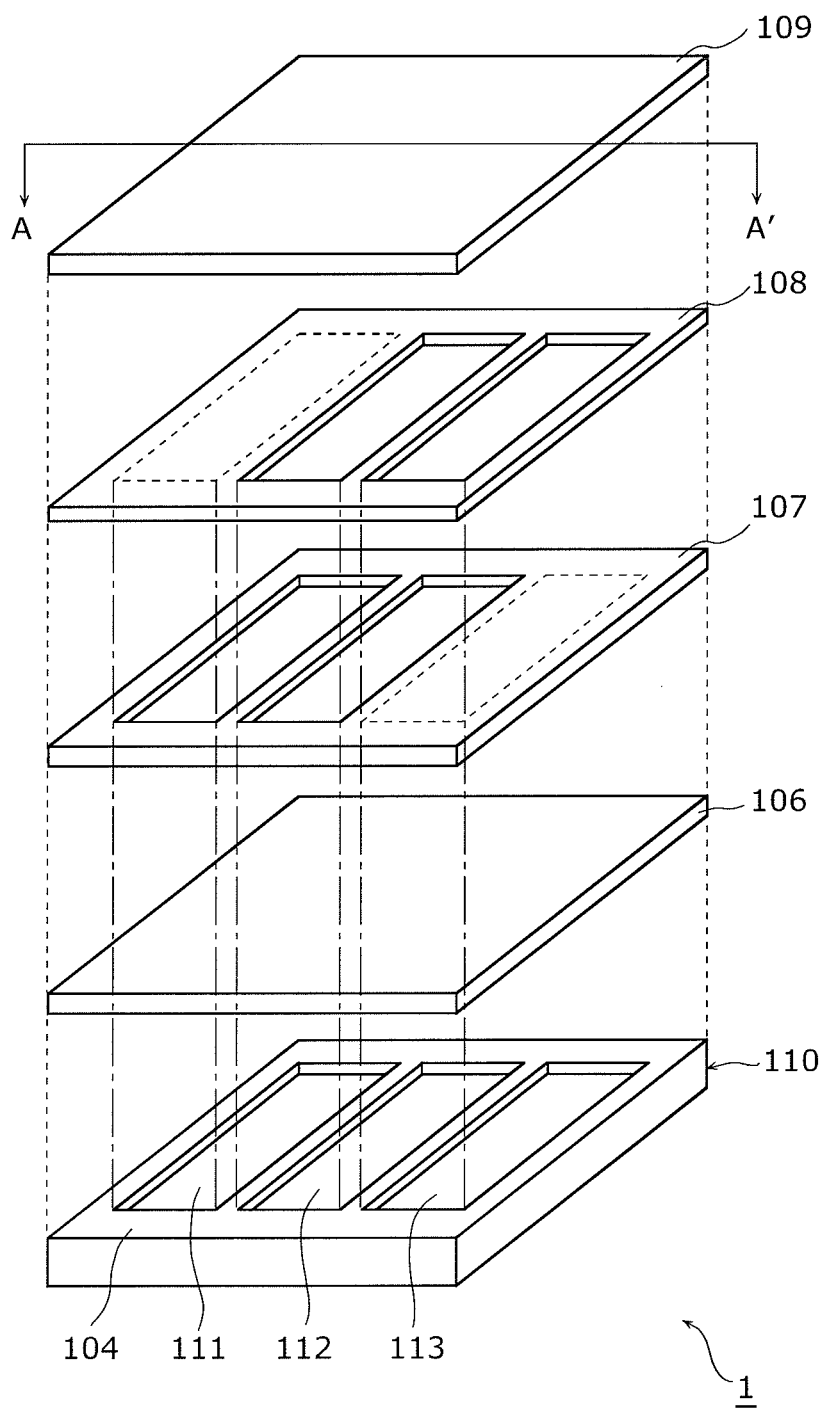
FIG. 1 is an exploded perspective view illustrating an example of a configuration for one pixel of an organic EL display device according to the example 1.

The organic EL display device according to the present invention includes: a main substrate; a display section provided above the main substrate and including a red organic EL light-emitting region, a non light-emitting region around the red organic EL light-emitting region, a green organic EL light-emitting region, a non light-emitting region around the green organic EL light-emitting region, a blue organic EL light-emitting region, and a non light-emitting region around the blue organic EL light-emitting region; a first light-adjusting layer provided above the display section, which selectively transmits blue light and selectively absorbs green light and red light; and a second light-adjusting layer provided above the display section, which selectively transmits the red light and selectively absorbs the blue light and the green light, in which the first light-adjusting layer is continuously formed over positions each corresponding to the blue organic EL light-emitting region, the non light-emitting region around the red organic EL light-emitting region, the non light-emitting region around the green organic EL light-emitting region, or the non light-emitting region around the blue organic EL light-emitting region, and has openings each at a position corresponding to the red organic EL light-emitting region or the green organic EL light-emitting region, and the second light-adjusting layer is continuously formed over positions each corresponding to the red organic EL light-emitting region, the non light-emitting region around the red organic EL light-emitting region, the non light-emitting region around the green organic EL light-emitting region, or the non light-emitting region around the blue organic EL light-emitting region, and has openings each at a position corresponding to the blue organic EL light-emitting region or the green organic EL light-emitting region.

With this, it is possible to suppress the reflection of external light at the non light-emitting region (the non light-emitting region around the red organic EL light-emitting region, the non light-emitting region around the green organic EL light-emitting region, and the non light-emitting region around the blue organic EL light-emitting region). Accordingly, the configuration has a contrast comparable to the configuration in which the black matrix is provided at a position corresponding to the non light-emitting region. In addition, the cost for material can be reduced, since it is not necessary to provide the black matrix. In addition, the manufacturing process for forming the black matrix is not necessary. Thus, it is possible to reduce the manufacturing cost.

In addition, the first light-adjusting layer and the second light-adjusting layer are provided overlapping with each other at all of the positions corresponding to the non light-emitting region around the red organic EL light-emitting region, the non light-emitting region around the green organic EL light-emitting region, and the non light-emitting region around the blue organic EL light-emitting region. With this, in any region of the display section, it is possible to set the reflectance in the non light-emitting region uniform. In other words, the luminance of the non light-emitting region is uniform. Consequently, it is possible to prevent the unevenness in the contrast of the display.

To put it differently, the organic EL display device according to the present invention can achieve high display quality at low cost.

In addition, it is preferable that a light-adjusting layer which selectively transmits the green light and selectively absorbs the red light and the blue light is omitted.

With this, it is possible to reduce the cost for materials and the manufacturing cost.

In addition, it is preferable that a combined transmission factor of the first light-adjusting layer and the second light-adjusting layer formed at positions each corresponding to the non light-emitting region around the red organic EL light-emitting region, the non light-emitting region around the green organic EL light-emitting region, or the non light-emitting region around the blue organic EL light-emitting region is 25% or less in a wavelength range from 500 nm to 630 nm.

With this, it is possible to effectively suppress the reflection of the external light at the non light-emitting region in a wavelength at which human eyes have high sensitivity.

In addition, the main substrate may include: a thin film transistor; and a planarizing film formed on the display section-side of the thin film transistor to cover the thin film transistor, and the organic EL display device may further include: an anode provided between the main substrate and the display section; and a cathode provided on the display section.

Furthermore, a third light-adjusting layer which selectively absorbs light having a wavelength between the red light and the green light may be included.

With this, it is possible to suppress the reflection of the external light. To put it differently, the black luminance is reduced. In addition, the chromaticity of red light and green light increases.

In addition, in the third light-adjusting layer, it is preferable that a maximum value of a transmission factor of visible light is 80% or higher, and a minimum value of the transmission factor of visible light is 50% or lower, wavelengths indicating a transmission factor of 60% are in ranges from 550 nm to 575 nm and from 585 nm to 620 nm, and a wavelength indicating the minimum value of the transmission factor is in a range from 570 nm to 600 nm.

With this, it is possible to suppress the reflection of the external light, while maintaining the light-extracting efficiency of the light emitted from the green organic EL light-emitting region and the light emitted from the red organic EL light-emitting region at high level.

In addition, it is preferable that the third light-adjusting layer is provided above the display section, and is substantially uniformly formed over the entirety of the display section.

With this, it is not necessary to perform patterning for forming the third light-adjusting layer. Thus, it is possible to manufacture the third light-adjusting layer at extremely low cost. In addition, it is possible to suppress the reflection on the entire display section.

In addition, the organic EL display device may further include a resin layer which is colored and provided above the display section, in which the resin layer functions as the third light-adjusting layer.

In addition, the first light-adjusting layer and the second light-adjusting layer may be formed on a sub substrate which is a component different from the main substrate, and the main substrate and the sub substrate may be bonded such that the display section faces the first light-adjusting layer and the second light-adjusting layer.

In addition, the sub substrate may be made of colored glass or plastic, and functions as the third light-adjusting layer.

In addition, at least one organic layer provided between an anode and a cathode of the organic EL display device may be colored, and the colored organic layer may function as the third light-adjusting layer.

The following shall describe an organic EL display device according to the embodiment of the present invention with reference to the drawings. In the embodiment, the advantage of the present invention shall be described through a comparison of four different configurations, namely, the examples 1 and 2 and the comparative examples 1 and 2. Note that, in the drawings, the same reference numerals are assigned to substantially identical components.

EXAMPLE 1

FIG. 1 is an exploded perspective view illustrating an example of a configuration for one pixel in the organic EL display device 1 according to the example 1 of the present invention.

The organic EL display device 1 in FIG. 1 is configured by bonding a display section 110 and a sub substrate 109 with a resin layer 106. A red light-emitting layer 111, a green light-emitting layer 112, and a blue light-emitting layer 113 which are light-emitting regions of red light, green light, and blue light, respectively, and a bank 104 which is a non light-emitting region are provided in the display section 110. A blue color filter 107 and a red color filter 108 are formed on the sub substrate 109.

Note that, the red light-emitting layer 111 is a red organic EL light-emitting region according to the present invention. The green light-emitting layer 112 is a green organic EL light-emitting region according to the present invention. The blue light-emitting layer 113 is a blue organic EL light-emitting region according to the present invention.

Figure 2:
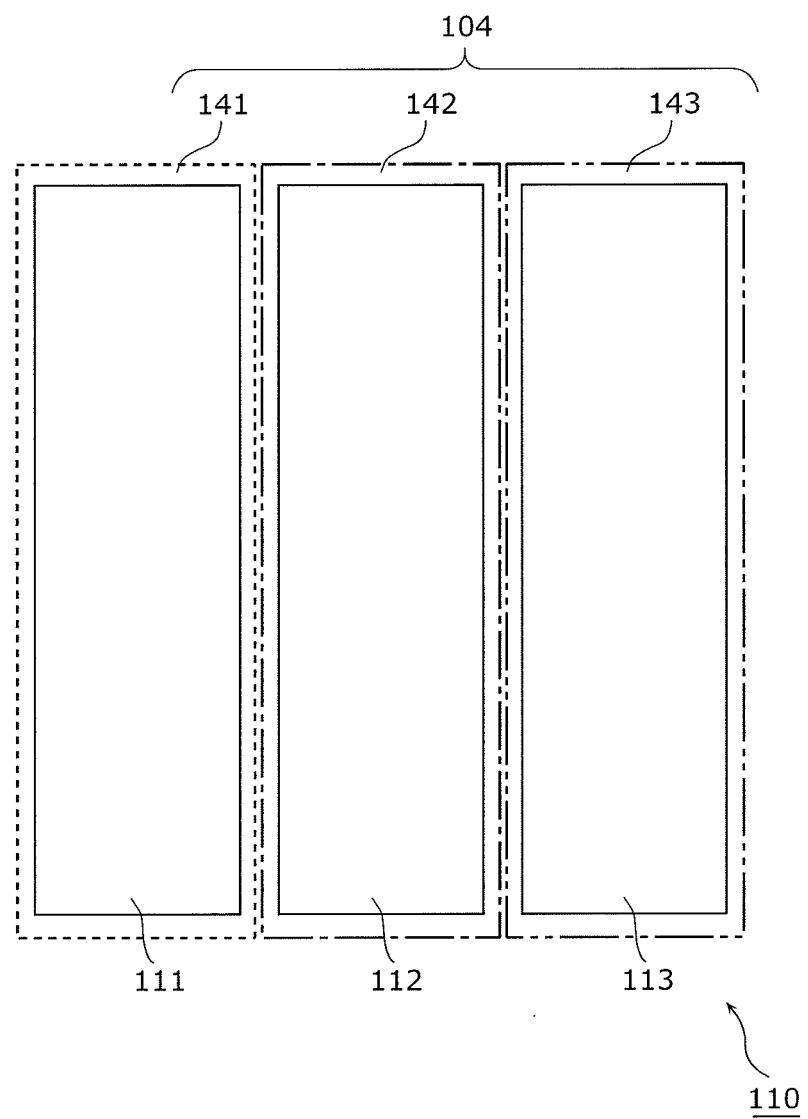
FIG. 2 is a top view illustrating a configuration for one pixel in the display section.

FIG. 2 is a top view illustrating a configuration for one pixel in the display section.

As illustrated in FIG. 2, the bank 104 includes a first sub bank 141, a second sub bank 142, and a third sub bank 143. The first sub bank 141 is a non light-emitting region around the red light-emitting layer 111, the second sub bank 142 is a non light-emitting region around the green light-emitting layer 112, and the third sub bank 143 is a non light-emitting region around the blue light-emitting layer 113. Note that, FIG. 2 is illustrated as such that there are gaps between the first sub bank 141 and the second sub bank 142, and between the second sub bank 142 and the third sub bank 143. However, FIG. 2 is a diagram for comprehensively illustrating each sub bank (the first sub bank 141, the second sub bank 142, or the third sub bank 143), and neighboring sub banks are adjoined. Note that, a case in which a bank is provided between adjacent pixels is illustrated as an example of the configuration of the non light-emitting region. However, it is not necessary to form a bank in the non light-emitting region in adjacent pixels.

The blue color filter 107 is the first light-adjusting layer according to the present invention, and selectively transmits the blue light, and selectively absorbs the green light and the red light. The blue color filter 107 is provided at a position to cover the blue light-emitting layer 113 and the bank 104. More specifically, the blue color filter 107 is continuously formed at positions corresponding to the blue light-emitting layer 113, the first sub bank 141, the second sub bank 142, and the third sub bank 143, and includes openings at positions each corresponding to the red light-emitting layer 111 or the green light-emitting layer 112.

The red color filter 108 is a second light-adjusting layer according to the present invention, and selectively transmits the red light, and selectively absorbs the blue light and the green light. The red color filter 108 is provided at positions over the red light-emitting layer 111 and the bank 104. More specifically, the red color filter 108 is continuously formed over positions corresponding to the red light-emitting layer 111, the first sub bank 141, the second sub bank 142, and the third sub bank 143, and includes openings each at a position corresponding to the green light-emitting layer 112 or the blue light-emitting layer 113.

Figure 3:
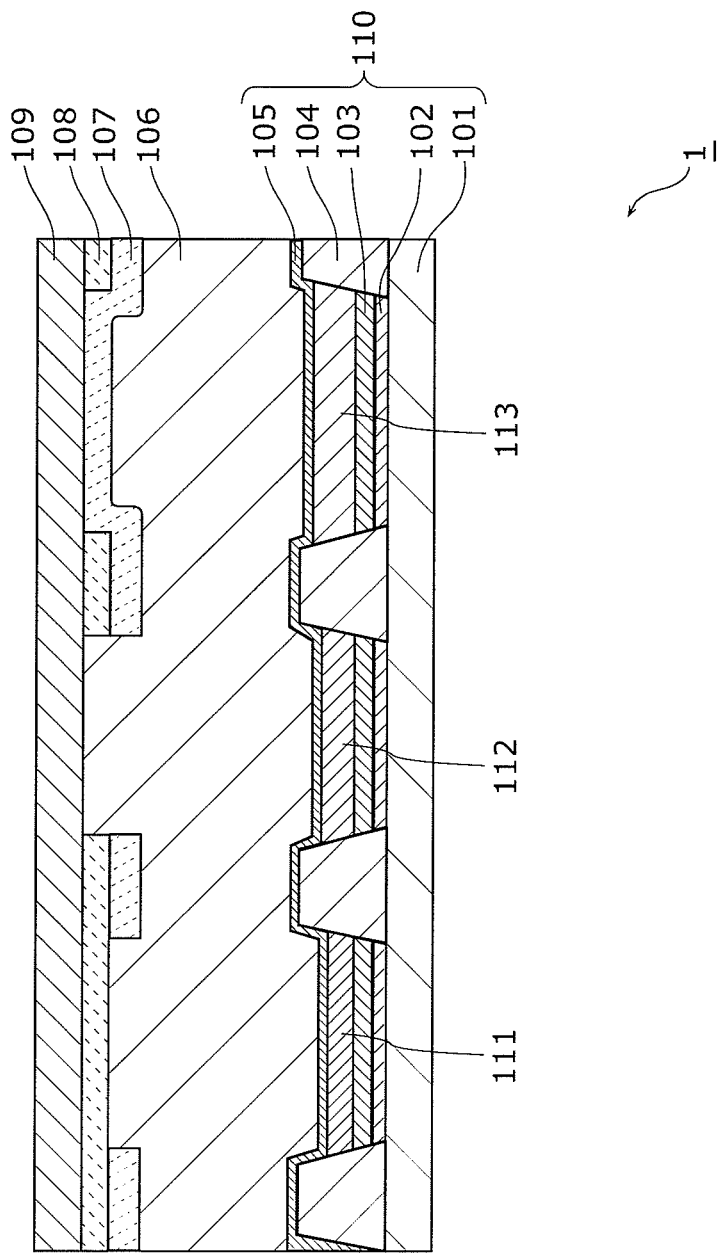
FIG. 3 is a cross-sectional view along AA' cross-section in FIG. 1.

FIG. 3 is a cross-sectional view along AA' cross-section in FIG. 1. The manufacturing method for the organic EL display apparatus 1 according to the example shall be described with reference to FIG. 3.

In the example 1, the description shall be made using a top-emission organic EL display device as an example. However, the same effect can be achieved by a bottom-emission organic EL display device.

First, the main substrate 101 is prepared. On the main substrate 101, a driving circuit including a transistor array and others which are conventionally known for an active matrix display device is formed. More specifically, the main substrate 101 includes a substrate, a transistor array, and a planarizing film stacked in this order. The substrate is made of glass and others, the transistor array is formed on the substrate, and the planarizing film is formed to cover the transistor array. The transistor array is implemented as thin film transistors (TFT), for example. Note that, here, an example of an active matrix display device is described, it is needless to say that display device may be a passive matrix display device.

Next, a reflexible anode 102 is formed, and is subsequently patterned into a predetermined shape. The material of the anode 102 is not particularly limited, and may be aluminum, silver, chromium, nickel, for example. In terms of light-emitting efficiency, a material with high reflectance can be suitably used. The anode 102 may be a multi-layered structure, and may be a structure including Indium Tin Oxide (ITO) formed on aluminum.

Next, the bank 104 is formed, and patterned so that an upper part of the anode 102 is exposed. The material of the bank 104 is not particularly limited, and an insulating and photosensitive resin is used, for example. The film-forming method and patterning method are not particularly limited. For example, after forming the non-patterned film by wet process, patterning by the photolithography method may be performed.

Next, a hole transport layer 103 is formed. The material for the hole transport layer 103 is not particularly limited. As an example, it may be a small-molecules material, a polymeric material, or a mixture of these materials. Furthermore, the method of forming the hole transport layer 103 is not particularly limited either, and it may be a wet process such as the ink-jet application, or a dry process such as the vapor deposition.

Next, the red light-emitting layer 111, the green light-emitting layer 112, and the blue light-emitting layer 113 are formed. The luminescent material used for the red light-emitting layer 111, the green light-emitting layer 112, and the blue light-emitting layer 113 may be a small-molecule material, a polymeric material, or a mixture of both. It is necessary for the luminescent materials to emit light with a chromaticity relatively close to a preferred chromaticity of the outgoing light. The generated spectrum by the luminescent material shall be described in detail later.

Next, the cathode 105 is formed. The cathode 105 has an electron injecting property, and can also serve as an electron injecting layer. Although the structure of the cathode 105 is not particularly limited, it is necessary for the cathode 105 to have a relatively high transmittance of visible light when the organic EL display device is of the top-emission type. For example, a stacked structure of Lithium Fluoride, Magnesium, and an alloy of Silver may be used.

Note that, the main substrate 101, the anode 102, the hole transport layer 103, the bank 104, the cathode 105, the red light-emitting layer 111, the green light-emitting layer 112, and the blue light-emitting layer 113 formed as described above compose the display section 110 illustrated in FIG. 1.

In addition, independent of the manufacturing process described above, the sub substrate 109 is prepared. The sub substrate 109 is a glass substrate or a plastic substrate, for example.

Next, on the sub substrate 109, the red color filter 108 having openings at positions each corresponding to the green light-emitting layer 112 or the blue light-emitting layer 113 by photolithography. More specifically, a resist which is photosensitive resin is applied on the sub substrate 109 by the spin coating method and others, for example, and the sub substrate 109 is pre-baked. Next, a predetermined photo mask is adhered, and pattern exposure using ultraviolet light is performed. With this, a predetermined region of the resist is hardened, and becomes insoluble. Subsequently, the part of the color resist that is not insoluble is removed using a developer, and a post baking is performed so as to obtain the red color filter 108 having a desired pattern. An organic colorant, a particle added organic colorant, a metal oxide, and resin including the metal oxide are a list of materials that can be used for the red color filter 108. In addition, the red color filter 108 may include inorganic or organic fluorescent pigments.

Next, in the same manner as the red color filter 108, the blue color filter 107 having openings at positions each corresponding to the red light-emitting layer 111 or the green light-emitting layer 112 is formed by photolithography. When forming the blue color filter 107, an organic colorant, a particle added organic colorant, a metal oxide, and resin including the metal oxide are a list of materials that can be used for the blue color filter 107. In addition, the blue color filter 107 may include inorganic or organic fluorescent pigments.

Finally, the sub substrate 109 supporting the blue color filter 107 and the red color filter 108, and the main substrate 101 supporting the red light-emitting layer 111, the green light-emitting layer 112, and the blue light-emitting layer 113 formed as described above are bonded by the resin layer 106.

The bonding method is not particularly limited. For example, there is a method in which the main substrate 101 and the sub substrate 109 are bonded by photo-curable resin, and the photo-curable resin is fixed by light irradiation. Here, as illustrated in FIGS. 1 and 3, the main substrate 101 and the sub substrate 109 are bonded with the resin layer 106 such that the openings are formed on the red color filter 108, and the region in which the blue color filter 107 is continuously formed overlaps with the blue light-emitting layer 113, and a region in which the red color filter 108 is continuously formed and the opening is formed on the blue color filter 107 overlaps with the red light-emitting layer 111, and a region in which the opening is formed on both the red color filter 108 and the blue color filter 107 are formed overlaps with the green light-emitting layer 112, and a region in which both the red color filter 108 and the blue color filter 107 are continuously formed overlaps with the bank 104.

As a result, the blue color filter 107 and the red color filter 108 are overlapped with each other on the bank 104, the red color filter 108 overlaps the red light-emitting layer 111, and no color filter is overlapped on the green light-emitting layer 112, and the blue color filter overlaps the blue light-emitting layer 113. As such, the organic EL display device 1 is manufactured.

EXAMPLE 2

The example 2 is nearly identical to the example 1, but is different in that a light-adjusting film which is the third light-adjusting layer is further provided on the sub substrate.

Figure 4:
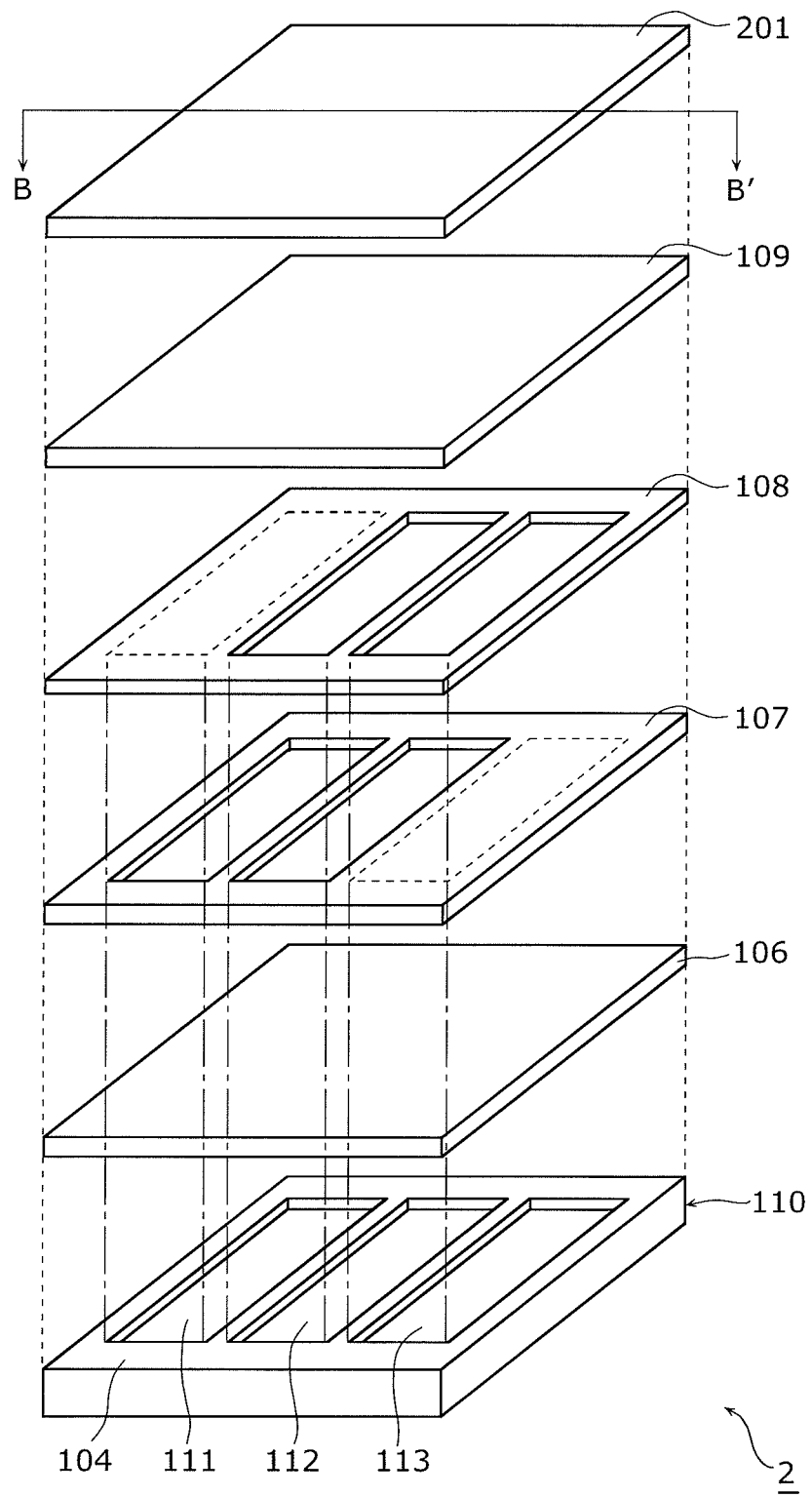
FIG. 4 is an exploded perspective view illustrating an example of a configuration for one pixel in an organic EL display device according to the example 2.
Figure 5:
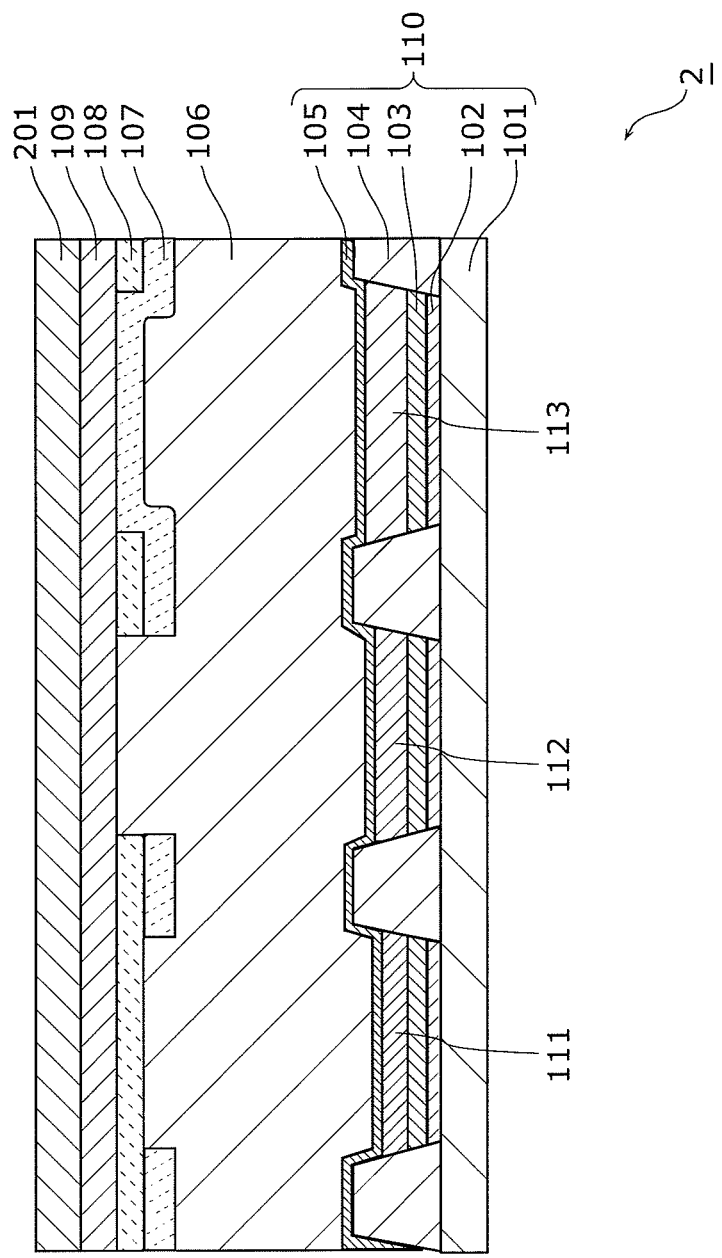
FIG. 5 is a cross-sectional view along BB' cross-section in FIG. 4.

FIG. 4 is an exploded perspective view illustrating an example of a configuration for one pixel in an organic EL display device 2 according to the example 2, and FIG. 5 is a cross-sectional view along BB' cross-section in FIG. 4.

As illustrated in FIGS. 4 and 5, compared to the organic EL display device 1 according to the example 1, the organic EL display device 2 according to the example 2 further includes a light-adjusting film 201 on a surface opposite to the surface of the sub substrate 109 on which the red color filter 109 is formed.

The light-adjusting film 201 selectively transmits the light having a wavelength between the wavelength of red light and the wavelength of green light, and is, for example, an optical film formed as a substantially uniform non-patterned film. The light-adjusting film 201 is set to have 80% or higher of a maximum value of the transmission factor of the visible light, and 50% or less of a minimum value of the transmission factor of the visible light. The wavelengths indicating 60% of the transmission factor are in ranges of wavelength from 550 nm to 575 nm, and from 585 nm to 620 nm, and the minimum value of the transmission factor is in a range of wavelength from 570 nm to 600 nm.

The method for bonding the light-adjusting film 201 and the sub substrate 109 is not particularly limited. For example, the light-adjusting film 201 and the sub substrate 109 are bonded using adhesive.

Subsequently, the red color filter 108 and the blue color filter 107 are formed on a surface of the sub substrate 109 opposite to the surface bonded with the light-adjusting film 201, according to the manufacturing method illustrated in the example 1.

Finally, in the same manner as the organic EL display device 1 according to the example 1, the sub substrate 109 supporting the light-adjusting film 201, the red color filter 108, and the blue color filter 107, and the main substrate 101 supporting the red light-emitting layer 111, the green light-emitting layer 112, and the blue light-emitting layer 113 are bonded with the resin layer 106.

Next, the comparative example 1 and the comparative example 2 shall be described. The comparative examples 1 and 2 are configured by modifying a part of the configuration of the example 1 for the comparison with the example 1 and the example 2.

COMPARATIVE EXAMPLE 1

The organic EL display device according to the comparative example 1 includes the red color filter, the green color filter, and the blue color filter separately provided corresponding to the positions of the red light-emitting layer, the green light-emitting layer, and the blue light-emitting layer, respectively, and a black matrix positioned with the non light-emitting region.

Figure 6:
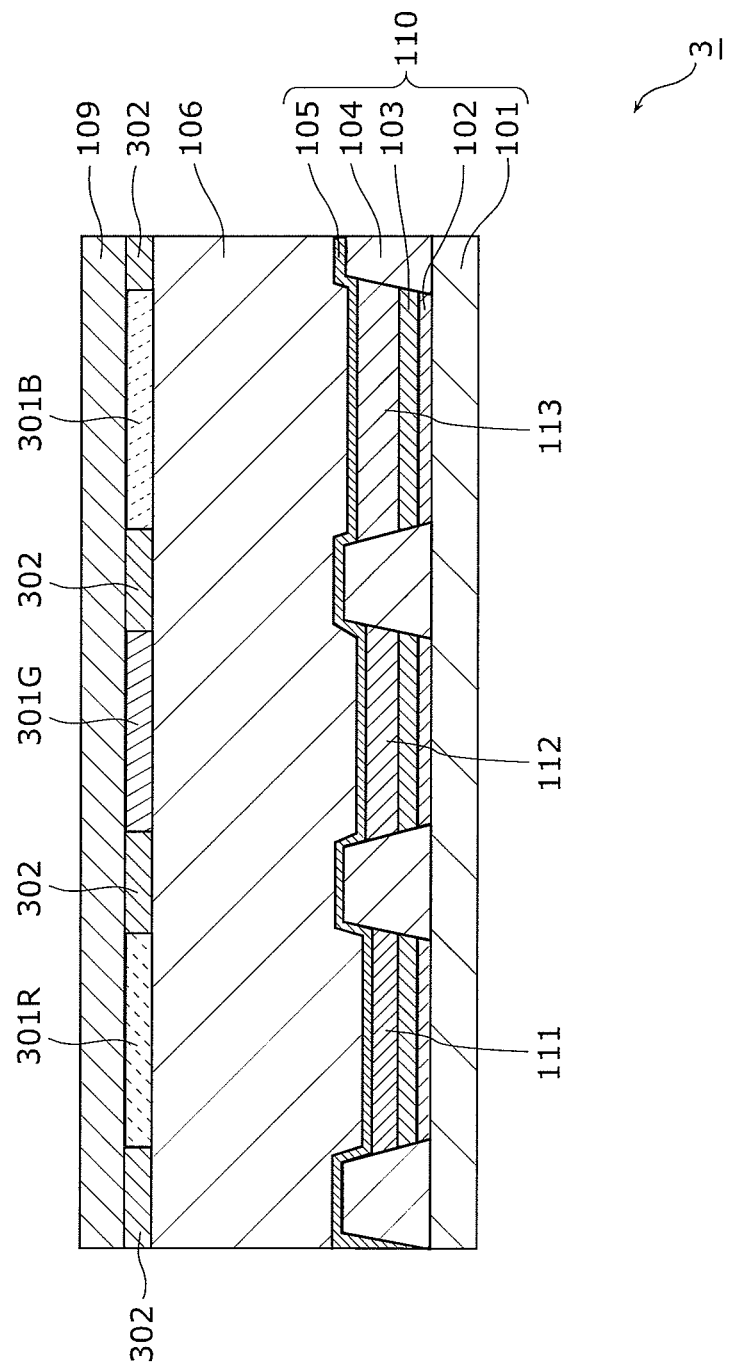
FIG. 6 is a cross-sectional view illustrating an example of a configuration for one pixel in an organic EL display device according to the comparative example 1.

FIG. 6 is a cross-sectional view illustrating an example of the configuration for one pixel in the organic EL display device 3 according to the comparative example 1.

As illustrated in FIG. 6, the organic EL display device 3 includes a red color filter 301R at a position corresponding to the red light-emitting layer 111, a green color filter 301G at a position corresponding to the green light-emitting layer 112, and a blue color filter 301B at a position corresponding to the blue light-emitting layer 113. In addition, the black matrix 302 is formed at a position corresponding to the bank 104.

The red color filter 301R and the blue color filter 301B are formed of the material same as the red color filter 108 and the blue color filter 107 in the example 1, respectively.

The green color filter 301G selectively transmits the green light, and selective absorbs the red light and the blue light.

The black matrix 302 is formed positioned with the bank 104, and absorbs the entire range of visible light. Although the material for the black matrix 302 is not particularly limited, chromium and resin with dispersed colorant or dye may be preferably used, for example.

The method for manufacturing the black matrix 302, the red color filter 301R, the green color filter 301G, and the blue color filter 301B on the sub substrate 109 is not particularly limited. For example, photolithography is one of the manufacturing methods.

More specifically, after chromium is formed on the sub substrate 109 by the sputtering method and others, a photo resist is applied according to the general photolithography method, and then exposure and development are performed using a photo mask. Subsequently, etching and resist removal are performed, forming the black matrix 302 with a desired pattern.

Next, the green color filter 301G, the red color filter 301R, and the blue color filter 301B are formed by performing lithography once for each of the color filters.

As described above, four lithography processes, that is, three photolithography processes each corresponding to red, green, or blue, and one photolithography process for forming the black matrix are necessary in the organic EL display device 3 according to the comparative example 1. Accordingly, it is evident that the manufacturing cost is higher than the organic EL display device 1 according to the example 1 and the organic EL display device 2 according to the example 2 manufactured by two photolithography processes.

COMPARATIVE EXAMPLE 2

The organic EL display device is manufactured in the same manner as the comparative example 1 except that the black matrix 302 and the green color filter 301G are not used.

Next, spectrums and transmission factors used as the premise of the consideration shall be described.

Figure 7:
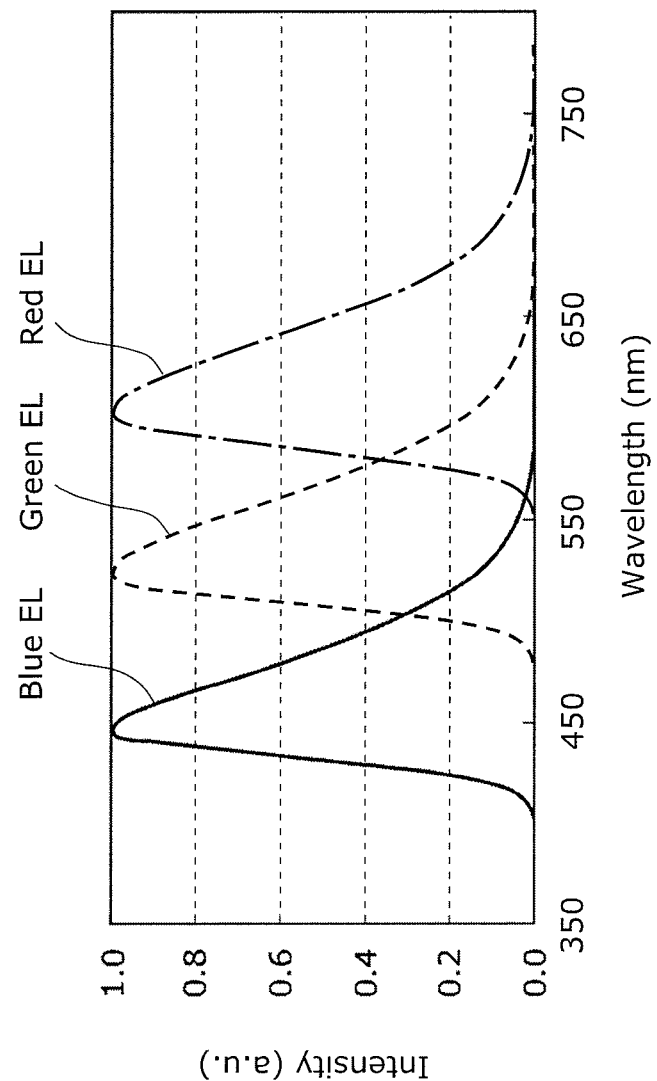
FIG. 7 is a graph illustrating spectrums of light emitted from red, green, and blue light-emitting material.

FIG. 7 is a graph illustrating the spectrums of light emitted from the red, green, and blue luminescent material (hereafter referred to as the EL spectrum) used for the examples 1 and 2 and the comparative examples 1 and 2. These are the spectrums before transmitting the red color filter, the green color filter, the blue color filter, and the light-adjusting film. FIG. 7 illustrates Red EL which is a spectrum of light emitted form the red light-emitting layer 111, Green EL which is a spectrum of light emitted from the green light-emitting layer 112, and Blue EL which is a spectrum of light emitted from the blue light-emitting layer 113.

The EL spectrums in FIG. 7 have typical shapes for organic EL light-emission spectrums, and are reproduced using a function similar to the normal distribution function.

Figure 8:
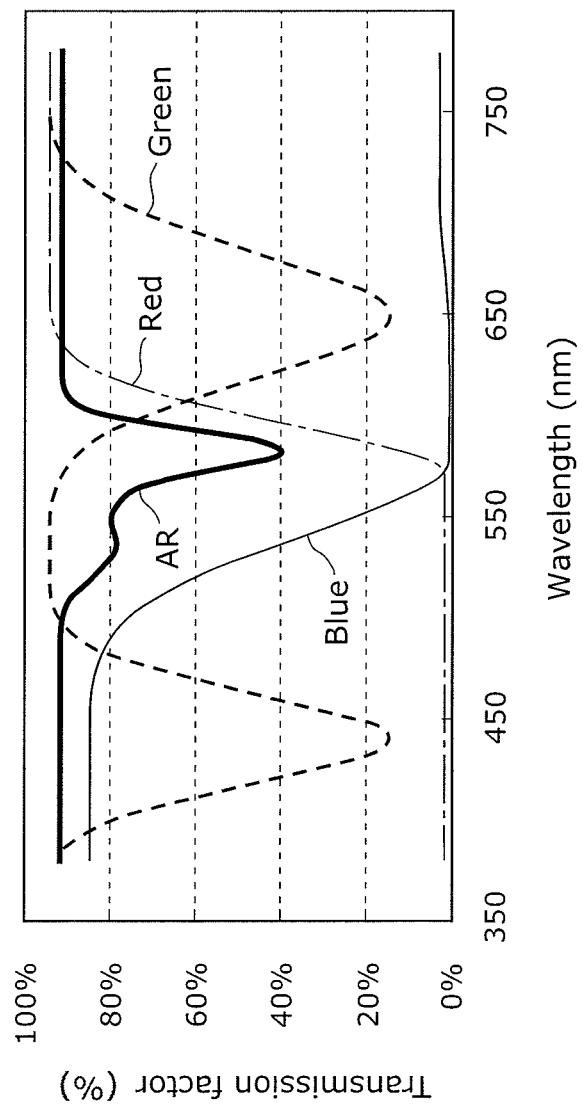
FIG. 8 is a graph illustrating transmission characteristics of a red color filter, a green color filter, a blue color filter, and a light-adjusting film.

FIG. 8 is a graph illustrating transmission characteristics of the red color filter, the green color filter, the blue color filter, and the light-adjusting film used for the examples 1 and 2 and the comparative examples 1 and 2.

In FIG. 8, red color filter transmission characteristics Red which is the transmission characteristics of the red color filter 108 and the red color filter 301R, blue color filter transmission characteristics Blue which is the transmission characteristics of the blue color filter 107 and the blue color filter 301B, green color filter transmission characteristics Green which is the transmission characteristics of the green color filter 301G, and the light-adjusting film transmission characteristics AR which is the transmission characteristics of the light-adjusting film 201.

The light-adjusting film transmission characteristics AR illustrated in FIG. 8 has the maximum value of transmission factor of the visible light of 80% or higher, the minimum value of the transmission factor of the visible light of 50% or lower, a wavelength indicating 60% of the transmission factor is in ranges from the 550 nm to 575 nm and from 585 nm to 620 nm, and the wavelength indicating the minimum value of the transmission factor is in a range from 570 nm to 600 nm.

Figure 9:
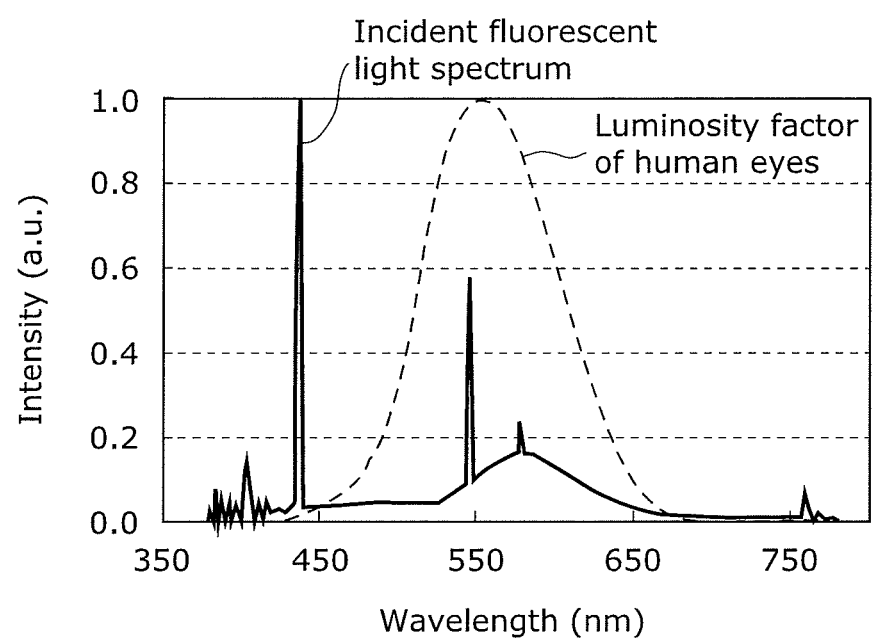
FIG. 9 is a graph illustrating a fluorescent light spectrum.

FIG. 9 is a graph illustrating a fluorescent light spectrum used for calculating the reflectance of external light in the examples 1 and 2 and the comparative examples 1 and 2. Note that, FIG. 9 also indicates a spectrum of luminosity factor of human eyes.

As illustrated in FIG. 9, the luminosity factor of the human eyes has a spectrum for perceiving light with the wavelength of 555 nm as the center. Therefore, in the spectrum of incident fluorescent light, suppressing a spectrum in a wavelength range in which human eyes have higher luminosity factor allows effectively suppressing the reflection of a luminescent light.

Figure 10:
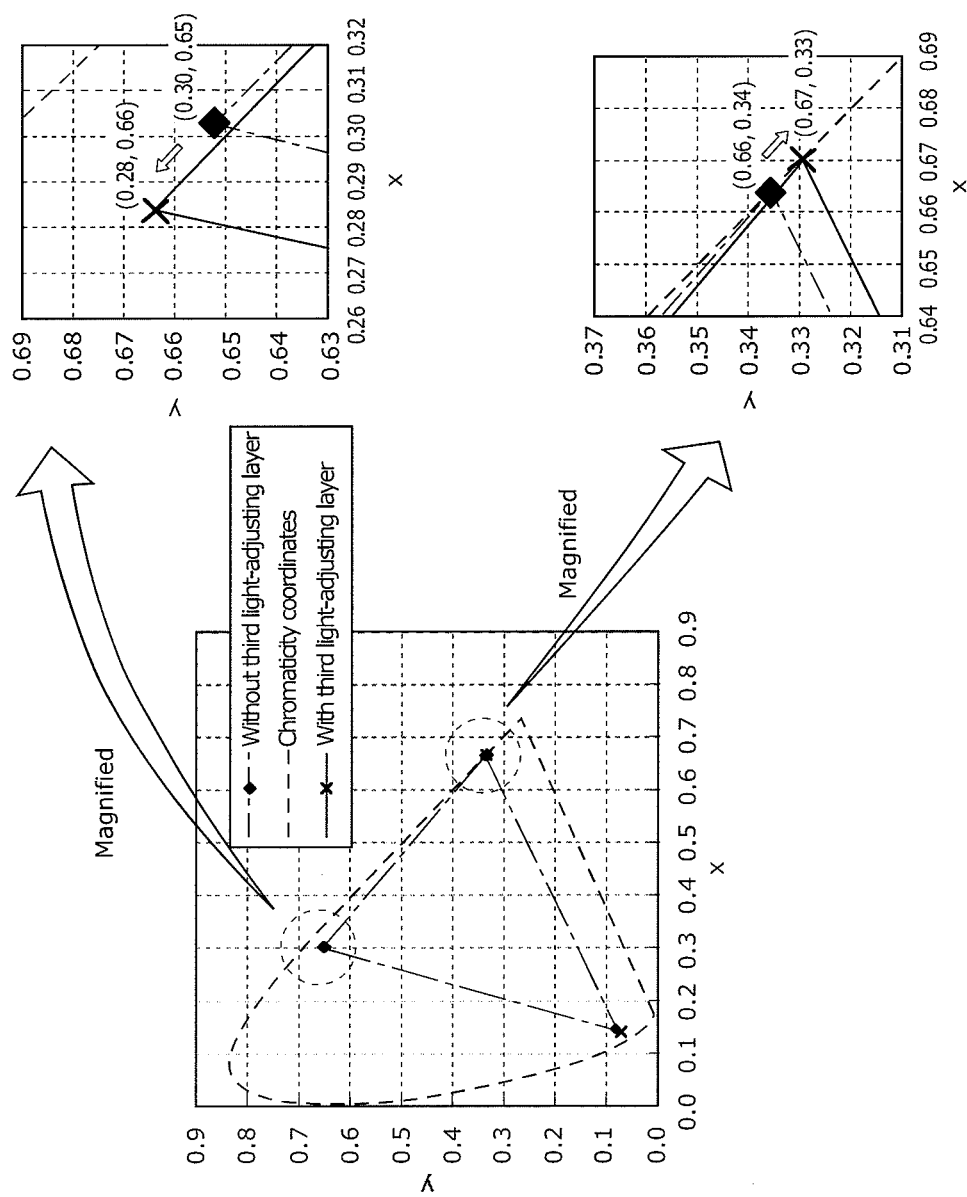
FIG. 10 is a graph illustrating a color gamut of the organic EL display device according to the examples 1 and 2.

FIG. 10 is a graph illustrating a color gamut of the organic EL display device according to the examples 1 and 2. The diagram is illustrated in the CIE color coordinates.

As illustrated in FIG. 10, in the organic EL display device according to the example 1, the chromaticity of red is (0.66, 0.34), the chromaticity of green is (0.30, 0.65), and in the organic EL display device 2 according to the example 2, the chromaticity of red is (0.67, 0.33), and the chromaticity of green is (0.28, 0.66). More specifically, compared to the chromaticity of red and green in the organic EL display device 1, the chromaticity of red and green in the organic EL display device 2 is improved.

Table 1 is a list of comparison results and the number of processes.

TABLE 1

| | Configuration | | | | | | | |
|---|---|---|---|---|---|---|---|---|
| | (CF) + film | Non light-emitting region | Number of processes | Chromaticity | | | Reflectance [%] | Transmission factor [%] |
| | | | | Red | Green | Blue | | |
| Example 1 | (R, B) | R, B | 2 | A | A | A | 19 | 104 |
| Example 2 | (R, B) + film | R, B | 2 | AA | AA | A | 11 | 90 |
| Comparative Example 1 | (R, G, B) | BM | 4 | A | AA | A | 15 | 100 |
| Comparative Example 2 | (R, B) | — | 2 | A | A | A | 69 | 100 |

R: Red color filter,
B: Blue color filter,
G: Green color filter,
Film: Light-adjusting film,
BM: Black matrix
AA: Very good,
A: Good Here, the number of processes is the number of photolithography process at the time of manufacturing.

The transmission factors are transmission factors of the examples 1 and 2 and the comparative example 2, when the transmission factor of the comparative example 1 is set as 100%.

The chromaticity is evaluated based on the spectrums after transmitting the color filters (red color filter, blue color filter, and green color filter) and the light-adjusting film. Good chromaticity indicates high color reproducibility.

The reflectance is evaluated by luminous reflectance calculated by a spectrum obtained by the fluorescent light spectrum in FIG. 9 transmitting the color filters and the light-adjusting film twice.

The comparison between the comparative example 1 and the examples 1 and 2 shows the following.

The number of the process is reduced to half, that is, twice both in the examples 1 and 2, compared to the four processes in the comparative example 1.

With this, compared to the comparative example 1, the manufacturing cost can be significantly reduced in the examples 1 and 2.

Note that, although a process for bonding the light-adjusting film is necessary in the example 2, the light-adjusting film is a non-patterned film with a substantially uniform thickness. Thus, patterning is not necessary. Accordingly, the increase in the manufacturing cost by providing the light-adjusting film is significantly small compared to the increase in the manufacturing cost for proving a color filter.

In addition, four materials for manufacturing the red color filter, the blue color filter, the green color filter, and the black matrix are necessary in the comparative example 1. In the example 1, only two types of materials for the red color filter and the blue color filter are necessary, suppressing the cost for the material. In the example 2, three types of materials, that is, the materials used in the example 1 and the material for the light-adjusting film are necessary. However, the cost for the material can be reduced compared to the comparative example 1.

As described above, the examples 1 and 2 can suppress the cost for material since the black matrix is not provided at a position overlapping with the non light-emitting region, and the red color filter and the blue color filter are used instead.

Furthermore, the comparison between the example 2 and the example 1 and the comparative example 1 shows the following.

In the example 2, the reflectance is low. As illustrated in FIG. 9, the luminosity factor of the human eyes has a peak at 555 nm, and has a high sensitivity to the light of wavelength in a range from 500 nm to 630 nm. As illustrated in FIG. 8, the light-adjusting film is set to have the maximum value of the transmission factor of the visible light of 80% or higher, the minimum value of the transmission factor of the visible light of 50% or lower, wavelengths indicating 60% of the transmission factor are in ranges from 550 nm to 575 nm and from 585 to 620 nm, the wavelength indicating the minimum value of the transmission factor in a range from 570 nm to 600 nm.

With this, it is possible to effectively suppress the sensitivity of the reflection of the external light to human eyes, reducing the black luminance. More specifically, the reflectance is represented by (spectrum intensity of incident light) x (transmission factor)$^2$. Thus, it is possible to significantly reduce the reflectance by suppressing the transmission factor. Thus, by lowering the transmission factor of the light in a wavelength in which the luminosity of human eyes is high, it is possible to significantly reduce the reflectance of the light in the wavelength. To put it differently, it is possible to effectively suppress the sensitivity of the reflected light on human eyes by setting the transmission factor of the light having a wavelength in which the luminosity factor of human eyes is high lower than the transmission factor of light having other wavelengths.

In addition, the wavelengths indicating 60% of transmission factor are in ranges from 550 to 575 nm, and from 585 to 620 nm. Thus, it is possible to maintain the light-extraction efficiency of Green EL emitted from the green light-emitting layer and the light-extraction efficiency of Red EL emitted from the red light-emitting layer illustrated in FIG. 7 at high level.

Furthermore, the comparison between the example 1 and the example 2 shows the following.

In the example 2, the chromaticity of red and green is increased. This is because, as described above, the minimum value of the light-adjusting film is in a range from 570 nm to 600 nm. Thus, the light in a wavelength range in which Green EL which is a spectrum of light emitted from the green light-emitting layer and Red EL which is a spectrum of light emitted from the red light-emitting layer illustrated in FIG. 7 overlaps with each other is suppressed.

With this, the chromaticity of light in red and green is improved. More specifically, the color gamut that can be represented by the organic EL display device is expanded, increasing the color reproducibility, as illustrated in FIG. 10.

Furthermore, the comparison between the examples 1 and 2 and the comparative example 2 shows the following.

In the examples 1 and 2, the reflectance is significantly reduced. This is because, while in the comparative example 2, the reflection is not suppressed since any color filter or black matrix is not provided on a position overlapping with the non light-emitting region, in the examples 1 and 2, the red color filter and the blue color filter are provided overlapping with each other.

Here, the combined transmission factor of the red color filter and the blue color filter provided at a position overlapping the non light-emitting region in the examples 1 and 2 shall be described. Furthermore, as a comparative example, the combined transmission factor when the red color filter and the green color filter are stacked, and the combined transmission factor when the green color filter and the blue color filter are stacked shall be described. The combined transmission factor is a transmission factor of light transmitting a set of stacked filters.

Figure 11:
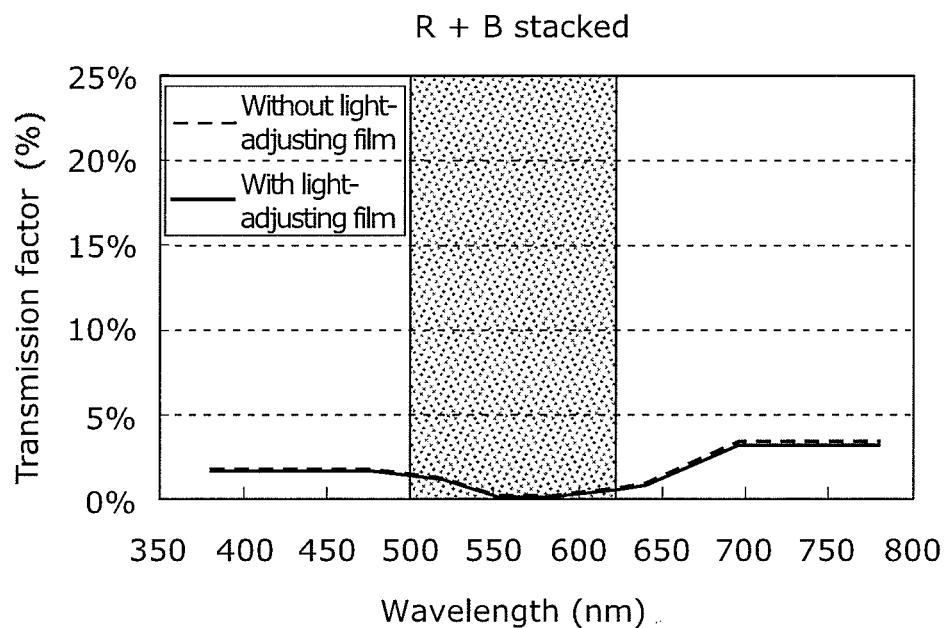
FIG. 11 is a graph illustrating a combined transmission factor of the red color filter and the blue color filter.

FIG. 11 is a graph illustrating a combined transmission factor of the red color filter and the blue color filter. FIG. 11 illustrates the combined transmission factor without the light-adjusting film, which is the configuration of the example 1, and the combined transmission factor with the light-adjusting film, which is the configuration of the example 2. Note that, the dark region in the background in FIG. 11 indicates a range of wavelengths in which the luminosity factor of human eyes is high (500 nm to 630 nm).

As illustrated in FIG. 11, the combined transmission factor of the red color filter and the blue color filter is 25% or lower in the wavelength range from 500 to 630 nm, regardless of whether or not the light-adjusting film is provided.

With this, it is possible to effectively suppress the sensitivity of the reflected light in the non light-emitting region to human eyes. In other words, contrast is increased.

Figure 12A:
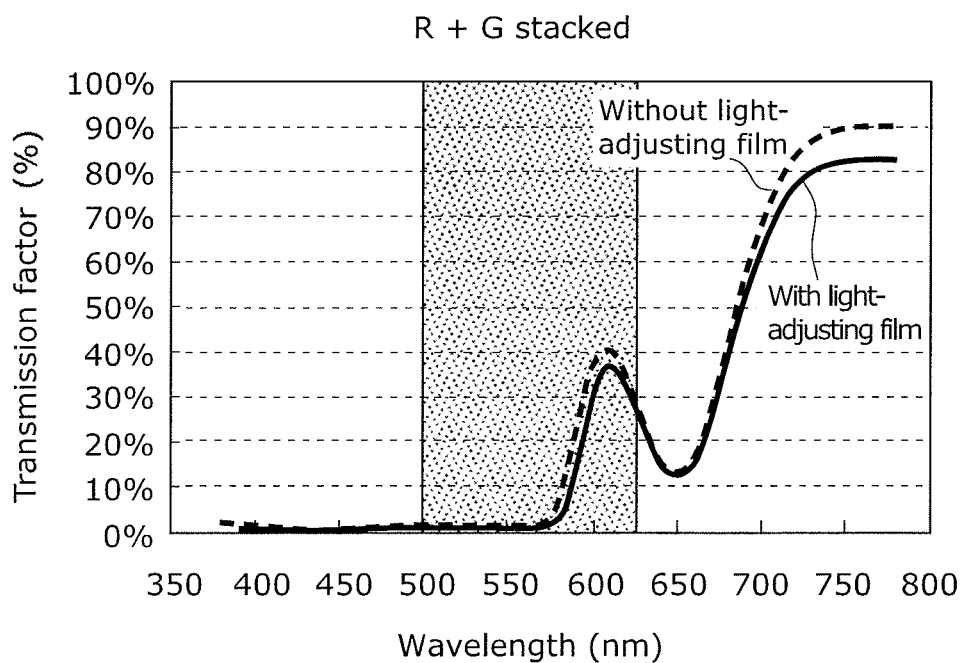
FIG. 12A is a graph illustrating a combined transmission factor of the red color filter and the green color filter.
Figure 12B:
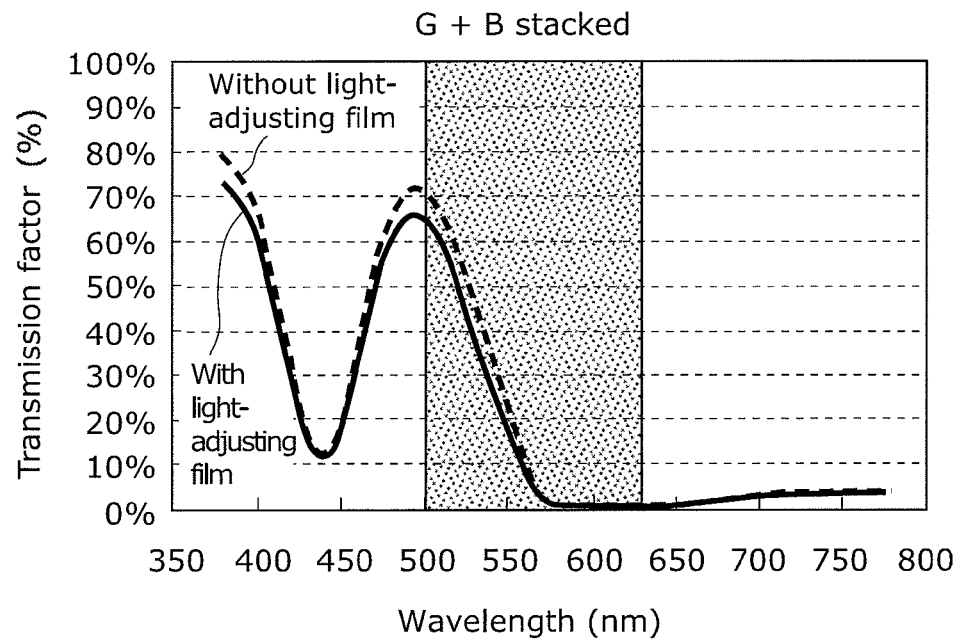
FIG. 12B is a graph illustrating a combined transmission factor of the green color filter and the blue color filter.

FIG. 12A is a graph illustrating the combined transmission factor of the red color filter and the green color filter. FIG. 12B is a graph illustrating the combined transmission factor of the green color filter and the blue color filter.

As illustrated in these diagrams, the stacked structure of the red color filter and the green color filter, and the stacked structure of the green color filter and the blue color filter do not sufficiently suppress the reflection of the external light due to high combined transmission factor. More specifically, in the wavelength range from 500 to 630 nm, there is a wavelength range in which the combined transmission factor is higher than 25%. As a result, the reflection of external light is not sufficiently suppressed. Therefore, contrast is low.

This shows that, in the examples 1 and 2, the reflection of external light is sufficiently suppressed by overlaying the red color filter and the blue color filter at a position overlapping the non light-emitting region. In addition, the reflectance in the examples 1 and 2 is comparable to the reflectance in the comparative example 1 including the black matrix. More specifically, the organic EL display device according to the examples 1 and 2 can sufficiently suppress the reflected light at the non light-emitting region by overlaying the red color filter and the blue color filter at a position overlapping the non light-emitting region, without providing the black matrix.

Note that, as a result of numerous calculations using the absorption spectrums of the first to third light-adjusting layers defined in the present invention, the conclusion is applicable even when the shape of the spectrum (the position of peak wavelength and spread of the spectrum) is slightly changed.

As described above, the organic EL display devices 1 and 2 in the examples 1 and 2 according to the present invention includes the blue color filter 107 and the red color filter 108 provided above the main substrate 101. The blue color filter 107 is continuously formed at positions corresponding to the blue light-emitting layer 113 and the bank 104, and has openings at positions each corresponding to the red light-emitting layer 111 or the green light-emitting layer 112. The red color filter 108 is continuously formed at positions corresponding to the red light-emitting layer 111 and the bank 104, and has openings at positions each corresponding to the green light-emitting layer 112 or the blue light-emitting layer 113.

With this, it is possible to suppress the reflection of external light at the bank 104 (the first sub bank 141, the second sub bank 142, and the third sub bank 143). Accordingly, this configuration has a comparable contrast compared to the configuration in which the black matrix is provided at a position corresponding to the bank 104. In addition, the cost for material can be reduced, since it is not necessary to provide the black matrix. In addition, the manufacturing process for forming the black matrix is not necessary. Thus, it is possible to reduce the manufacturing cost.

In addition, at a position corresponding to all of the first sub bank 141, the second sub bank 142, and the third sub bank 143, the blue color filter 107 and the red color filter 108 are provided overlapping with each other. With this, in any region of the display section, it is possible to set the reflectance in the bank 104 uniform. In other words, the luminance at the bank 104 is set to be uniform. Consequently, it is possible to prevent the unevenness in the contrast of the display.

More specifically, the organic EL display devices 1 and 2 in the examples 1 and 2 according to the present invention can achieve high display quality at low cost.

Furthermore, the organic EL display device 2 according to the example 2 of the present invention includes the light-adjusting film 201 substantially uniformly formed over the entire range of the display section, in addition to the configuration of the organic EL display device 1 according to the example 1. With this, it is possible to suppress the reflection of the external light in the entire range of the display section. To put it differently, the black luminance is reduced. In addition, the chromaticity of red light and green light increases.

Although only some exemplary embodiments of the organic EL display device according to the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

For example, in the example 2 described above, the light-adjusting film 201 provided on the sub substrate 109 is the third light-adjusting layer according to the present invention. However, the sub substrate 109 may be made of colored glass or plastic having transmission characteristics of the third light-adjusting layer, or the resin layer 106 may be colored and has the transmission characteristics of the third light-adjusting layer.

Furthermore, in the manufacturing process of the color filter in general, after forming all of the patterns for each color, the upper part of the pattern is protected by a transparent resin film (hereafter referred to as a protecting layer). As the protecting layer, polyimide, acrylic, and epoxy resins may be used, for example. The protecting layer may have a function of the third light-adjusting layer.

Furthermore, at least one of organic layer provided between the anode 102 and the cathode 105 may be colored, and the colored organic layer may have the function of the third light-adjusting layer.

Furthermore, in the examples 1 and 2, as illustrated in FIG. 2, the red light-emitting layer 111, the green light-emitting layer 112, and the blue light-emitting layer 113 are a pixel set, and each pixel set is substantially square in top view. However, the shape of the red light-emitting layer 111, the green light-emitting layer 112, and the blue light-emitting layer 113 is not limited to this example. For example, each of the red light-emitting layer 111, the green light-emitting layer 112, and the blue light-emitting layer 113 may be substantially square in shape. Furthermore, the pixel sets may be arranged in any way.

Figure 13A:
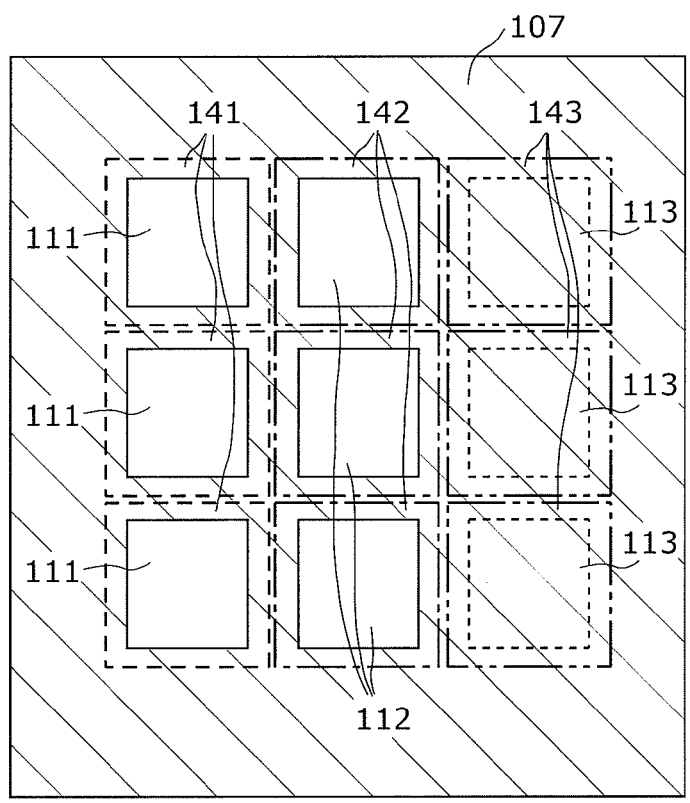
FIG. 13A is a top view illustrating an example of the arrangement of the light-emitting layer.
Figure 13B:
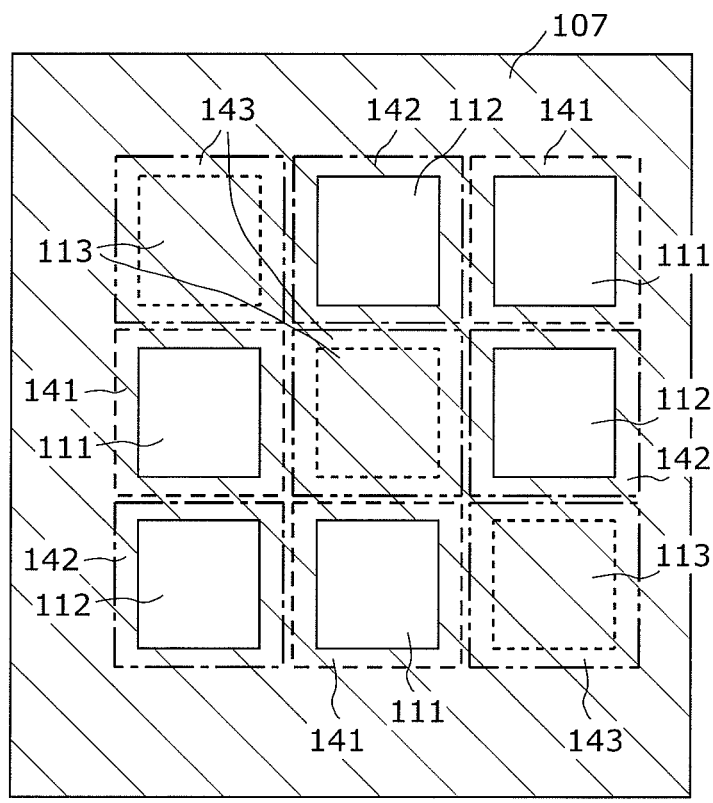
FIG. 13B is a top view illustrating another example of the arrangement of the light-emitting layer.

For example, the light-emitting layer of the same color may be arranged in the column direction as illustrated in FIG. 13A, or as illustrated in FIG. 13B, the light-emitting layer of the same color may be arranged in the column direction and the row direction as illustrated in FIG. 13B. Note that, in FIGS. 13A and 13B, the red color filter 108 provided on the display section is illustrated.

In the examples 1 and 2, the blue color filter 107, the red color filter 108 and the sub substrate 109 are stacked in this order from the side of the main substrate 101, however, the stacking order is not limited to this example. For example, the stacking order may be from the red color filter 108, the blue color filter 107, and the sub substrate 109, or from the sub substrate 109, the blue color filter 107, and the red color filter 108.

Figure 14:
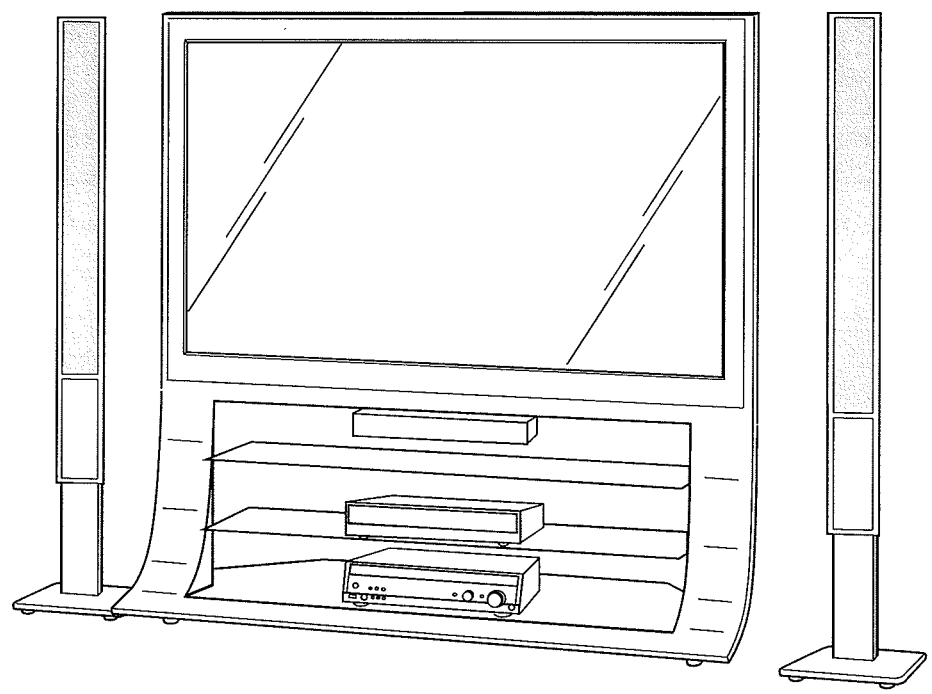
FIG. 14 is a schematic view illustrating an example of the organic EL display device.

Note that, the organic EL display devices 1 and 2 may be implemented as the organic EL display device having a flat panel as illustrated in FIG. 14. The organic EL display device is manufactured at lower cost without degrading the display capability, compared to the conventional display device.

Industrial Applicability

The present invention is applicable to the organic light-emitting display device having a flat light source, a flat display, and others.

What is claimed is:

1. An organic electro-luminescence (EL) display device comprising:
   a main substrate;
   a display section provided above the main substrate and including a red organic EL light-emitting region, a non light-emitting region around the red organic EL light-emitting region, a green organic EL light-emitting region, a non light-emitting region around the green organic EL light-emitting region, a blue organic EL light-emitting region, and a non light-emitting region around the blue organic EL light-emitting region;
   a first light-adjusting layer provided above the display section, which selectively transmits blue light and selectively absorbs green light and red light;
   a second light-adjusting layer provided above the display section, which selectively transmits the red light and selectively absorbs the blue light and the green light; and
   a third light-adjusting layer which selectively absorbs light having a wavelength between the red light and the green light,
   wherein a light-adjusting layer which selectively transmits the green light and selectively absorbs the red light and the blue light is omitted,
   the first light-adjusting layer is continuously formed over positions each corresponding to the blue organic EL light-emitting region, the non light-emitting region around the red organic EL light-emitting region, the non light-emitting region around the green organic EL light-emitting region, or the non light-emitting region around the blue organic EL light-emitting region, and has openings each at a position corresponding to the red organic EL light-emitting region or the green organic EL light-emitting region, the second light-adjusting layer is continuously formed over positions each corresponding to the red organic EL light-emitting region, the non light-emitting region around the red organic EL light-emitting region, the non light-emitting region around the green organic EL light-emitting region, or the non light-emitting region around the blue organic EL light-emitting region, and has openings each at a position corresponding to the blue organic EL light-emitting region or the green organic EL light-emitting region, the third light-adjusting layer is provided above the display section, and is substantially uniformly formed over the entirety of the display section, and in the third light-adjusting layer, a maximum value of a transmission factor of visible light is 80% or higher, and a minimum value of the transmission factor of visible light is 50% or lower, wavelengths indicating a transmission factor of 60% are in ranges from 550 nm to 575 nm and from 585 nm to 620 nm, and a wavelength indicating the minimum value of the transmission factor is in a range from 570 nm to 600 nm.

2. The organic EL display device according to claim 1,
wherein a combined transmission factor of the first light-adjusting layer and the second light-adjusting layer formed at positions each corresponding to the non light-emitting region around the red organic EL light-emitting region, the non light-emitting region around the green organic EL light-emitting region, or the non light-emitting region around the blue organic EL light-emitting region is 25% or less in a wavelength range from 500 nm to 630 nm.

3. The organic EL display device according to claim 1,
wherein the main substrate includes: a thin film transistor; and a planarizing film formed on the display section-side of the thin film transistor to cover the thin film transistor, and the organic EL display device further comprises:
an anode provided between the main substrate and the display section; and
a cathode provided on the display section.

4. The organic EL display device according to claim 1, further comprising
a resin layer which is colored and provided above the display section,
wherein the resin layer functions as the third light-adjusting layer.

5. The organic EL display device according to claim 1,
wherein the first light-adjusting layer and the second light-adjusting layer are formed on a sub substrate which is a component different from the main substrate, and
the main substrate and the sub substrate are bonded such that the display section faces the first light-adjusting layer and the second light-adjusting layer.

6. The organic EL display device according to claim 5,
wherein the sub substrate is made of colored glass or plastic, and functions as the third light-adjusting layer.

* * * * *